United States Patent
Higashi et al.

(10) Patent No.: US 12,317,413 B2
(45) Date of Patent: May 27, 2025

(54) HIGH-FREQUENCY MODULE AND COMMUNICATION DEVICE

(71) Applicant: Murata Manufacturing Co., Ltd., Kyoto (JP)

(72) Inventors: Masateru Higashi, Kyoto (JP); Shogo Yanase, Kyoto (JP); Masaki Kimura, Kyoto (JP); Masanari Miura, Kyoto (JP); Naoya Matsumoto, Kyoto (JP); Takahiro Katamata, Kyoto (JP); Takanori Uejima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 279 days.

(21) Appl. No.: 18/299,767

(22) Filed: Apr. 13, 2023

(65) Prior Publication Data

US 2023/0262879 A1  Aug. 17, 2023

Related U.S. Application Data

(63) Continuation of application No. PCT/JP2021/038487, filed on Oct. 18, 2021.

(30) Foreign Application Priority Data

Oct. 26, 2020  (JP) .................. 2020-179230

(51) Int. Cl.
*H05K 1/02* (2006.01)
*H04B 1/40* (2015.01)

(52) U.S. Cl.
CPC ............. *H05K 1/0243* (2013.01); *H04B 1/40* (2013.01); *H05K 1/0218* (2013.01); *H05K 2201/1006* (2013.01)

(58) Field of Classification Search
CPC ............... H05K 1/0243; H05K 1/0218; H05K 2201/1006; H04B 1/40
(Continued)

(56) References Cited

U.S. PATENT DOCUMENTS 9,048,805 B2* 6/2015 Granger-Jones ....... H04B 1/525
2014/0133117 A1* 5/2014 Saji .......................... H01L 24/19
361/761

(Continued)

FOREIGN PATENT DOCUMENTS

JP  2019-220827 A  12/2019
JP  2020-167449 A  10/2020
(Continued)

OTHER PUBLICATIONS

International Search Report for PCT/JP2021/038487 dated Jan. 18, 2022.

*Primary Examiner* — Binh B Tran
(74) *Attorney, Agent, or Firm* — McDonald Hopkins LLC

(57) ABSTRACT

A first filter is prevented from being affected by the coplanarity of a mounting substrate and a degradation of the filter characteristics of the first filter is reduced. A first filter, a second filter, a third filter, and a first switch are mounted on a first principal surface of a mounting substrate. The first filter passes a first high-frequency signal and a second high-frequency signal, the second filter passes a third high-frequency signal, and the third filter passes a fourth high-frequency signal. The first switch is capable of simultaneously connecting the first filter and the second filter to an antenna terminal. In a plan view from a thickness direction of the mounting substrate, the first filter is larger than the second filter and the third filter and located between the second filter and the third filter. A first wire and a second wire are each shorter than a third wire.

20 Claims, 3 Drawing Sheets

(58) Field of Classification Search
USPC .......................................................... 361/783
See application file for complete search history.

(56) References Cited

U.S. PATENT DOCUMENTS

| | | | |
|---|---|---|---|
| 2014/0167877 A1* | 6/2014 | Shimizu | H03H 7/463 |
| | | | 333/101 |
| 2019/0386631 A1 | 12/2019 | Ueno | |
| 2020/0313632 A1 | 10/2020 | Yoshioka et al. | |
| 2020/0382149 A1 | 12/2020 | Nagamori et al. | |
| 2020/0403596 A1 | 12/2020 | Yamaguchi et al. | |
| 2021/0409046 A1 | 12/2021 | Yamaguchi | |

FOREIGN PATENT DOCUMENTS

| | | |
|---|---|---|
| WO | 2019/176538 A1 | 9/2019 |
| WO | 2019/188875 A1 | 10/2019 |
| WO | 2020/184613 A1 | 9/2020 |

* cited by examiner

HIGH-FREQUENCY MODULE AND COMMUNICATION DEVICE

CROSS REFERENCE TO RELATED APPLICATION

This is a continuation of International Application No. PCT/JP2021/038487 filed on Oct. 18, 2021 which claims priority from Japanese Patent Application No. 2020-179230 filed on Oct. 26, 2020. The contents of these applications are incorporated herein by reference in their entireties.

BACKGROUND ART

Technical Field

The present disclosure generally relates to a high-frequency module and a communication device, and more specifically, to a high-frequency module including a plurality of filters and a communication device including the high-frequency module.

Patent Document 1 describes a front-end circuit (high-frequency module) that is applied to carrier aggregation using a plurality of communication frequency bands.

The front-end circuit described in Patent Document 1 includes a wide-band filter (first filter), a transmission filter, and switches. The wide-band filter passes both a signal in a reception frequency band that is a first communication frequency band and a signal in a reception frequency band that is a second communication frequency band and is close to or overlaps the reception frequency band that is the first communication frequency band. The transmission filter passes a signal in a transmission frequency band that is the first communication frequency band or a signal in a transmission frequency band that is the second communication frequency band. The switches simultaneously connect at least two of the plurality of filters including the wide-band filter and the transmission filter to an antenna.

Patent Document 1: International Publication No. 2019/176538

BRIEF SUMMARY

In the high-frequency module described in Patent Document 1, for example, in carrier aggregation in which a signal that passes through the wide-band filter and a signal that passes through the transmission filter are simultaneously communicated, the total bandwidth of the reception frequency band and the transmission frequency band may be relatively large. In this case, there are risks that, depending on how the wide-band filter, the transmission filter, and the switches are arranged on a mounting substrate on which the wide-band filter, the transmission filter, the switches, and the like are mounted, the characteristics of the wide-band filter are degraded and affected by the coplanarity of the mounting substrate.

The present disclosure provides a high-frequency module and a communication device that can prevent a first filter from being affected by the coplanarity of a mounting substrate and reduce a degradation of the filter characteristics of the first filter.

A high-frequency module according to an aspect of the present disclosure includes a mounting substrate, a first filter, a second filter, a third filter, an antenna terminal, and a switch. The mounting substrate has a first principal surface and a second principal surface that face each other. The first filter is mounted on the first principal surface of the mounting substrate and passes a first high-frequency signal in a first frequency band and a second high-frequency signal in a second frequency band with a higher frequency than the first frequency band. The second filter is mounted on the first principal surface of the mounting substrate and passes a third high-frequency signal in a third frequency band different from the first frequency band and the second frequency band. The third filter is mounted on the first principal surface of the mounting substrate and passes a fourth high-frequency signal in a fourth frequency band different from the first frequency band, the second frequency band, and the third frequency band. The switch is capable of simultaneously connecting the first filter and the second filter to the antenna terminal. The first frequency band and the second frequency band are bands adjacent to each other or bands with frequencies that overlap each other in part. In a plan view from a thickness direction of the mounting substrate, the first filter is larger than the second filter and the third filter and located between the second filter and the third filter. A first wire for connecting the first filter to the switch and a second wire for connecting the second filter to the switch are each shorter than a third wire for connecting the third filter to the switch.

A communication device according to an aspect of the present disclosure includes the high-frequency module described above, and a signal processing circuit. The signal processing circuit is connected to the high-frequency module.

With the high-frequency module and the communication device according to the aspects of the present disclosure, it is possible to prevent the first filter from being affected by the coplanarity of the mounting substrate and reduce a degradation of the filter characteristics of the first filter.

DETAILED DESCRIPTION

Figure 1:
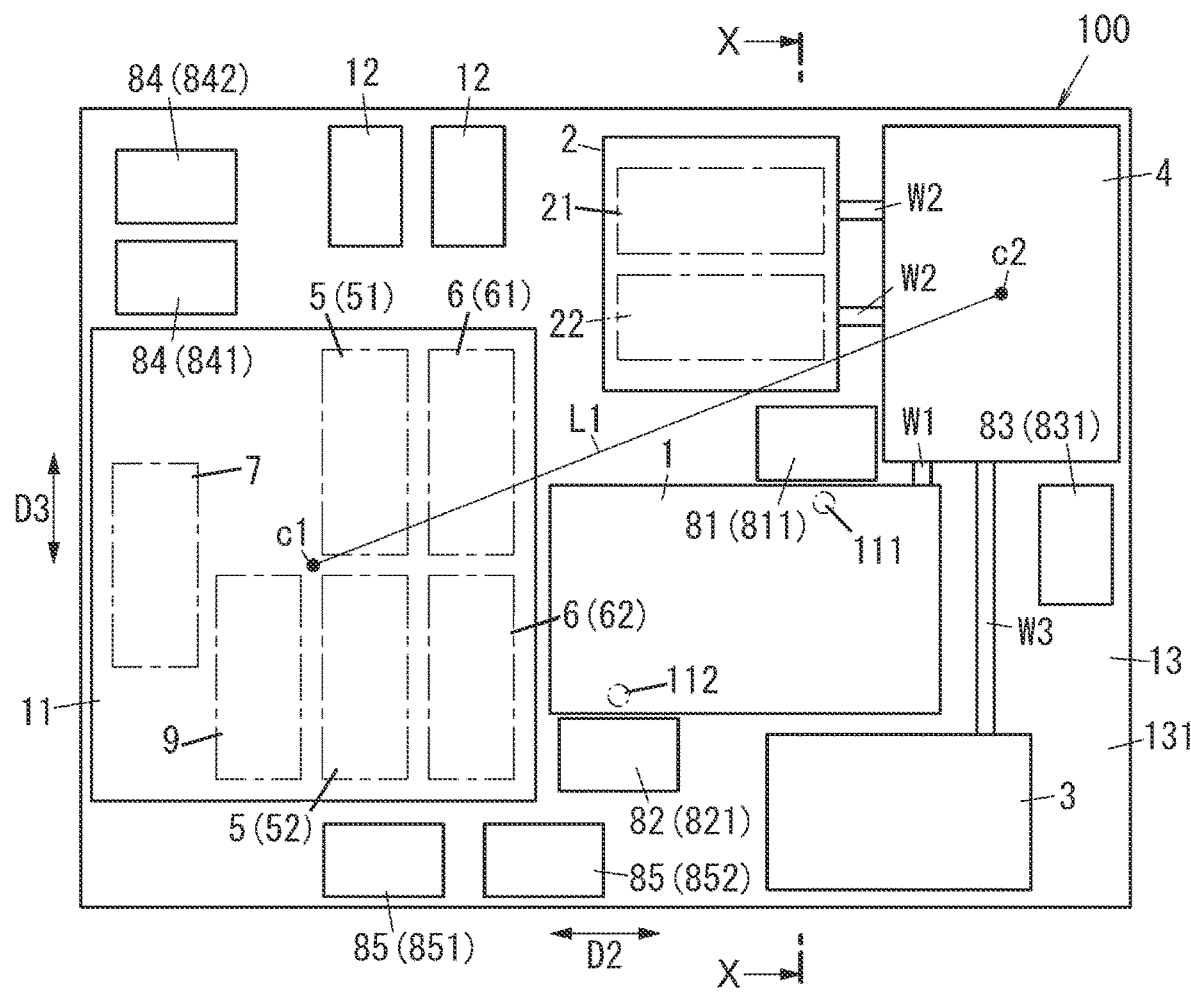
FIG. 1 is a plan view illustrating a high-frequency module according to an embodiment in which a shield layer and a resin layer are omitted.
Figure 2:
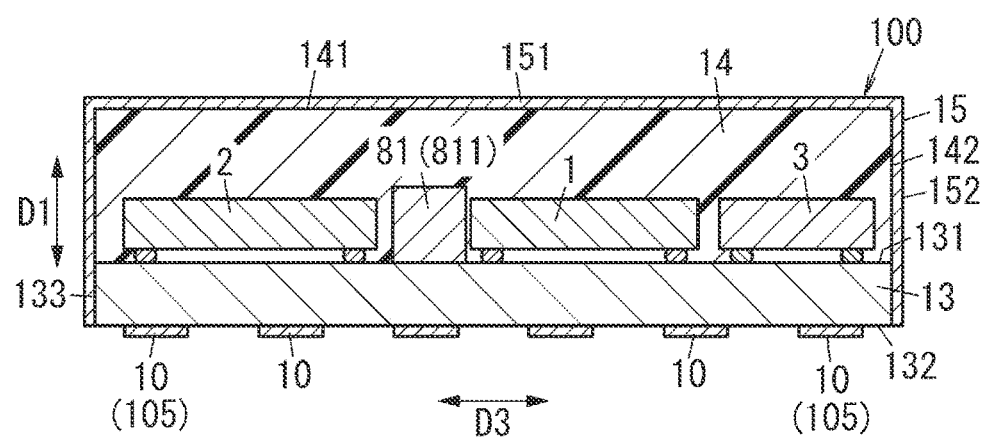
FIG. 2 is a sectional view taken along the line X-X of FIG. 1, illustrating the high-frequency module.
Figure 4:
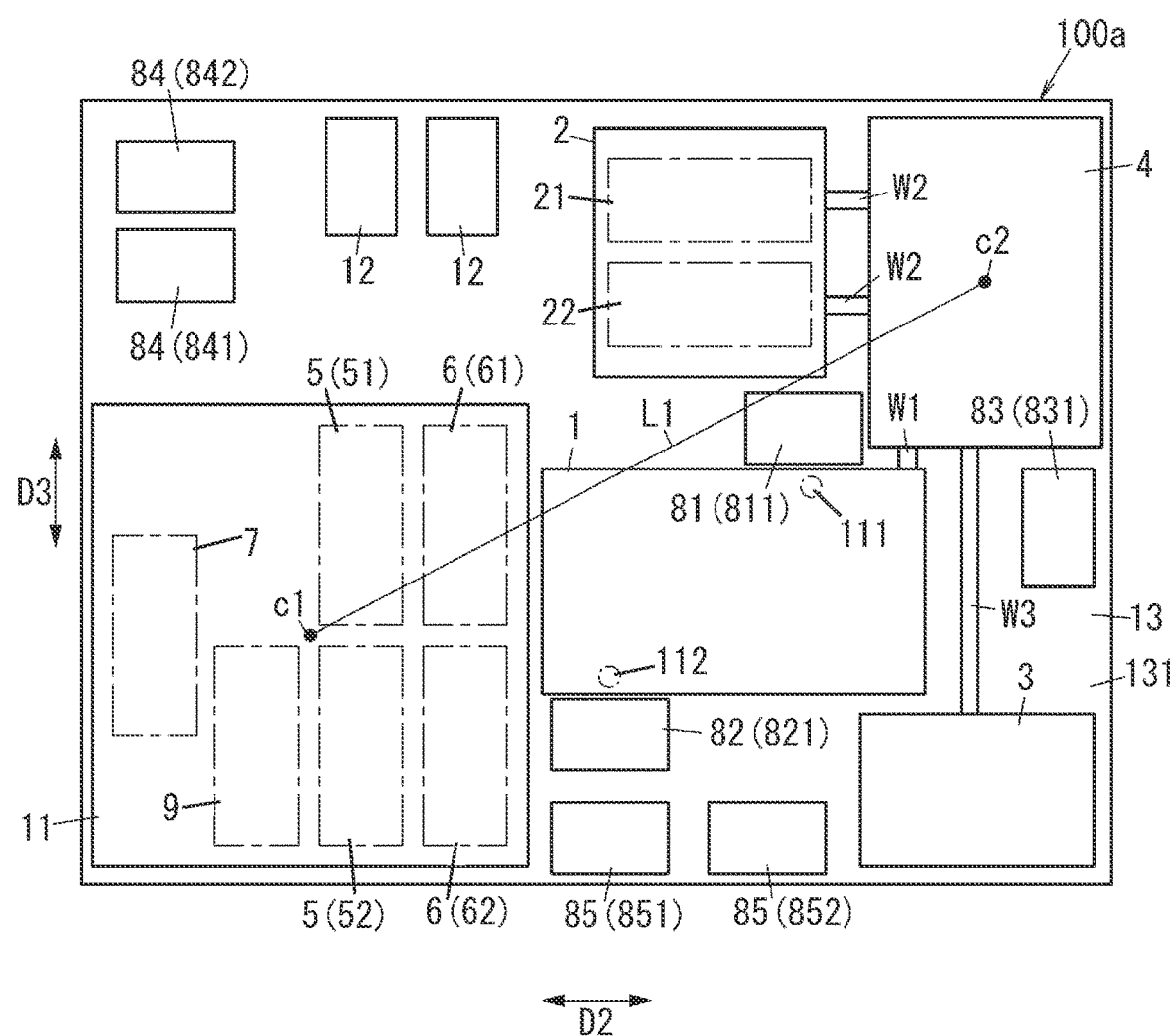
FIG. 4 is a plan view illustrating a high-frequency module according to Modification 1 of the embodiment in which a shield layer and a resin layer are omitted.

FIG. 1, FIG. 2, and FIG. 4, which are referred to in the following embodiment and the like, are all schematic diagrams, and the ratios of the sizes and thicknesses of respective components in the diagrams do not necessarily reflect the actual dimension ratios.

Embodiment

A high-frequency module 100 according to the present embodiment includes, as illustrated in FIG. 1 and FIG. 2, a mounting substrate 13, a first filter 1, second filters 21 and 22, a third filter 3, an antenna terminal 101 (see FIG. 3), and a first switch (switch) 4. The mounting substrate 13 has a first principal surface 131 and a second principal surface 132 that face each other.

The first filter 1 is mounted on the first principal surface 131 of the mounting substrate 13 and passes a first high-frequency signal in a first frequency band and a second high-frequency signal in a second frequency band. In the present embodiment, as an example, the first high-frequency signal and the second high-frequency signal are each a reception signal (a first reception signal or a second reception signal). The first frequency band includes, for example, the frequency band of Band 28. Band 28 is a frequency band of from 758 MHz to 803 MHz. The second frequency band includes, for example, the frequency band of Band 20. Band 20 is a frequency band of from 791 MHz to 821 MHz. That is, in the high-frequency module 100 according to the present embodiment, the second frequency band is a higher frequency band than the first frequency band. Further, in the high-frequency module 100, the first frequency band and the second frequency band are bands with frequencies that overlap each other in part.

The second filters 21 and 22 are mounted on the first principal surface 131 of the mounting substrate 13 and pass a third high-frequency signal in a third frequency band different from the first frequency band and the second frequency band. In the present embodiment, as an example, the third high-frequency signal is a reception signal (third reception signal). The third frequency band includes, for example, at least one of the frequency band of Band 8 and the frequency band of Band 26. In the present embodiment, the third frequency band includes both the frequency band of Band 8 and the frequency band of Band 26. Band 8 is a frequency band of from 925 MHz to 960 MHz. Band 26 is a frequency band of from 859 MHz to 894 MHz.

The third filter 3 is mounted on the first principal surface 131 of the mounting substrate 13 and passes a fourth high-frequency signal in a fourth frequency band different from the first frequency band, the second frequency band, and the third frequency band. In the present embodiment, as an example, the fourth high-frequency signal is a reception signal (fourth reception signal). The fourth frequency band includes, for example, the frequency band of Band 12 or the frequency band of Band 13. In the present embodiment, the fourth frequency band includes the frequency band of Band 12. Band 12 is a frequency band of from 729 MHz to 746 MHz. Band 13 is a frequency band of from 746 MHz to 756 MHz.

Figure 3:
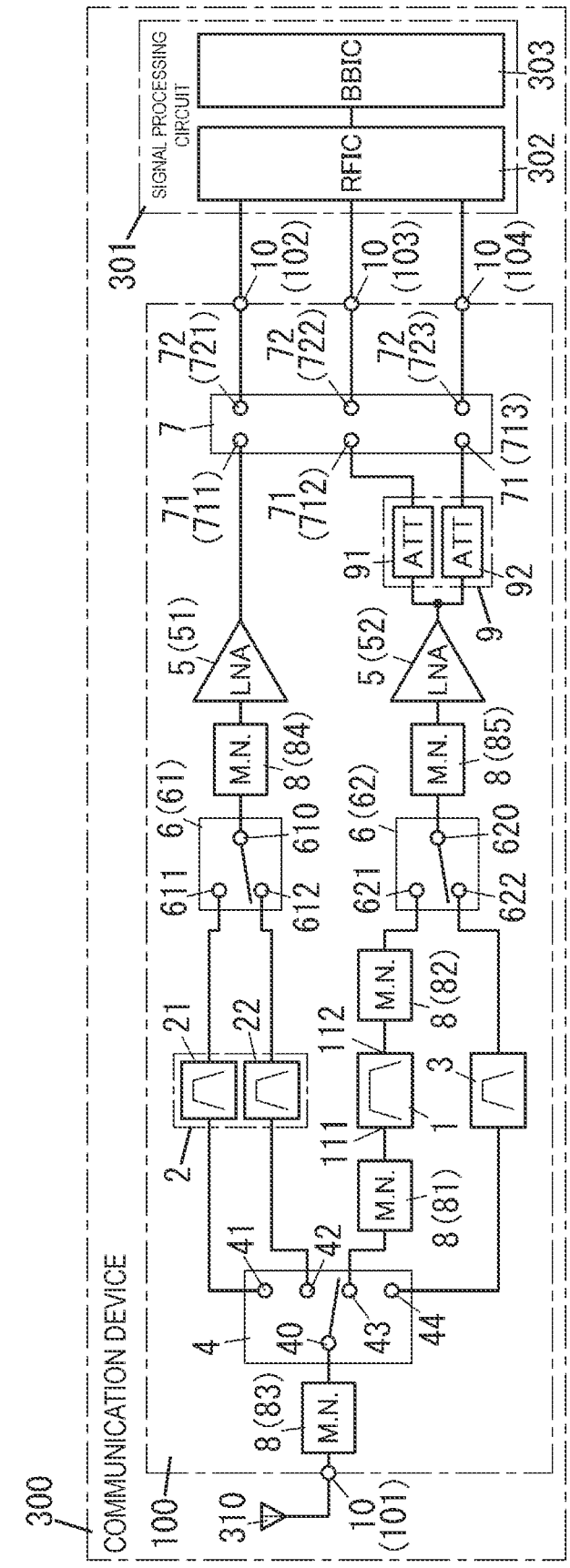
FIG. 3 is a circuit configuration diagram of a communication device including the high-frequency module.

The antenna terminal 101 (see FIG. 3) is connected to an antenna 310 (see FIG. 3). With the first switch 4, the first filter 1 and the second filters 21 and 22 can be simultaneously connected to the antenna 310. In a plan view from a thickness direction D1 of the mounting substrate 13, the first filter 1 is larger than the second filters 21 and 22 and the third filter 3 and located between the second filters 21 and 22 and the third filter 3. Here, "the first filter 1 and the second filters 21 and 22 can be simultaneously connected" means that a simultaneous communication using the first filter 1 and the second filters 21 and 22 can be performed. Further, "a simultaneous communication can be performed" indicates that communications in, of frequency bands defined by the Third Generation Partnership Project (3GPP) Long Term Evolution (LTE) standard and frequency bands in communication bands defined by the 5G New Radio (NR) standard, frequency bands overlapping each other in part or not overlapping each other at all can be simultaneously performed.

A first wire W1 for connecting the first filter 1 to the first switch 4 and a second wire W2 for connecting the second filters 21 and 22 to the first switch 4 are each shorter than a third wire W3 for connecting the third filter 3 to the first switch 4.

With this, the high-frequency module 100 according to the present embodiment can prevent the first filter 1 from being affected by the coplanarity of the mounting substrate 13 and reduce a degradation of the characteristics of the first filter 1.

Now, the high-frequency module 100 according to the present embodiment and a communication device 300 are described with reference to FIG. 1 to FIG. 4.

(1) High-Frequency Module and Communication Device (1.1) Circuit Configurations of High-Frequency Module and Communication Device First, the circuit configurations of the high-frequency module 100 according to the present embodiment and the communication device 300 are described with reference to FIG. 3.

The high-frequency module 100 according to the present embodiment is used for the communication device 300, for example. The communication device 300 is, for example, a mobile phone (for example, a smartphone). The communication device 300 is, however, not limited to a mobile phone and may be, for example, a wearable device (for example, a smartwatch). The high-frequency module 100 is, for example, a module that can support the fourth-generation mobile communication (4G) standard or the fifth-generation mobile communication (5G) standard. The 4G standard is, for example, the 3GPP LTE standard. The 5G standard is, for example, 5G NR. The high-frequency module 100 is, for example, a module that can support carrier aggregation and dual connectivity. Here, carrier aggregation and dual connectivity are technologies used for communications that simultaneously use radio waves in a plurality of frequency bands. In the high-frequency module 100 according to the present embodiment, as described above, the first filter 1 and the second filters 21 and 22 can be simultaneously connected to the antenna 310 with the first switch 4. That is, in the high-frequency module 100 according to the present embodiment, for example, a communication can be performed in which the first reception signal in the first frequency band that passes through the first filter 1 and the third reception signal in the third frequency band that passes through the second filters 21 and 22 are simultaneously received.

The high-frequency module 100 can amplify, for example, a reception signal (high-frequency signal) input from the antenna 310 and output the resultant to a signal processing circuit 301. The signal processing circuit 301 is not a component of the high-frequency module 100 but a component of the communication device 300 including the high-frequency module 100. The high-frequency module 100 is controlled by, for example, the signal processing circuit 301 included in the communication device 300. The communication device 300 includes the high-frequency module 100 and the signal processing circuit 301. The communication device 300 further includes the antenna 310. The communication device 300 further includes a circuit board (not illustrated) having the high-frequency module 100 mounted thereon. The circuit board is, for example, a printed wiring board. The circuit board includes a ground electrode with a ground potential.

The signal processing circuit 301 includes, for example, an RF signal processing circuit 302 and a baseband signal processing circuit 303. The RF signal processing circuit 302 is, for example, a radio frequency integrated circuit (RFIC) and performs signal processing on a high-frequency signal. The RF signal processing circuit 302 performs signal processing, such as up conversion, on a high-frequency signal (transmission signal) output from the baseband signal processing circuit 303, for example, and outputs the high-frequency signal subjected to the signal processing. Further, the RF signal processing circuit 302 performs signal processing, such as down conversion, on a high-frequency signal (reception signal) output from the high-frequency module 100, for example, and outputs the high-frequency signal subjected to the signal processing to the baseband signal processing circuit 303.

The baseband signal processing circuit 303 is, for example, a baseband integrated circuit (BBIC). The baseband signal processing circuit 303 generates an I-phase signal and a Q-phase signal from a baseband signal. The baseband signal is, for example, an externally input audio signal, image signal, or the like. The baseband signal processing circuit 303 combines the I-phase signal with the Q-phase signal by I/Q modulation processing and outputs a transmission signal. On this occasion, the transmission signal is generated as a modulated signal (IQ signal) obtained by performing, on a carrier signal with a predetermined frequency, amplitude modulation with a period longer than the period of the carrier signal in question. A reception signal processed by the baseband signal processing circuit 303 is used as an image signal for image display or an audio signal for a phone call, for example. The high-frequency module 100 according to the present embodiment transmits a high-frequency signal (reception signal) between the antenna 310 and the RF signal processing circuit 302 of the signal processing circuit 301.

The high-frequency module 100 includes, as illustrated in FIG. 3, the first filter 1, a filter device 2, and the third filter 3. Moreover, the high-frequency module 100 further includes a plurality of (for example, two) low noise amplifiers 5 and a plurality of (for example, five) matching circuits 8. Moreover, the high-frequency module 100 further includes the first switch 4, a plurality of (for example, two) second switches 6, and a third switch 7. Moreover, the high-frequency module 100 further includes a power splitter 9.

Further, the high-frequency module 100 has a plurality of external connection terminals 10. The plurality of external connection terminals 10 include the antenna terminal 101, a plurality of (for example, three) signal output terminals 102 to 104, and a plurality of ground terminals 105 (see FIG. 2). The plurality of ground terminals 105 are terminals with the ground potential electrically connected to the ground electrode of the above-mentioned circuit board included in the communication device 300.

In the following description, when the plurality of low noise amplifiers 5 need to be distinguished from each other, the plurality of respective low noise amplifiers 5 are referred to as a first low noise amplifier 51 and a second low noise amplifier 52. Further, when the plurality of second switches 6 need to be distinguished from each other, the plurality of respective second switches 6 are referred to as a second switch 61 and a second switch 62. Moreover, when the plurality of matching circuits 8 need to be distinguished from each other, the plurality of respective matching circuits 8 are referred to as a first matching circuit 81, a second matching circuit 82, a third matching circuit 83, a fourth matching circuit 84, and a fifth matching circuit 85.

The first low noise amplifier 51 has a first input terminal and a first output terminal. The first low noise amplifier 51 amplifies the third reception signal in the third frequency band input to the first input terminal and outputs the resultant from the first output terminal. The first input terminal of the first low noise amplifier 51 is connected to a common terminal 610 of the second switch 61 with the fourth matching circuit 84 interposed therebetween. The first output terminal of the first low noise amplifier 51 is connected to a first terminal 711 of the third switch 7.

The second low noise amplifier 52 has a second input terminal and a second output terminal. The second low noise amplifier 52 amplifies the first reception signal in the first frequency band, the second reception signal in the second frequency band, and the fourth reception signal in the fourth frequency band which are input to the second input terminal and outputs the resultant from the second output terminal. The second input terminal of the second low noise amplifier 52 is connected to a common terminal 620 of the second switch 62 with the fifth matching circuit 85 interposed therebetween. The second output terminal of the second low noise amplifier 52 is connected to the power splitter 9.

The first filter 1 is, for example, a band pass filter with pass bands including a reception band that is the first frequency band and a reception band that is the second frequency band. The first frequency band includes, as described above, the frequency band of Band 28. The second frequency band includes, as described above, the frequency band of Band 20. The first filter 1 has an input terminal 111 and an output terminal 112. The input terminal 111 of the first filter 1 is connected to a selection terminal 43 of the first switch 4 with the first matching circuit 81 interposed therebetween. The output terminal 112 of the first filter 1 is connected to a selection terminal 621 of the second switch 62 with the second matching circuit 82 interposed therebetween.

The filter device 2 includes, as illustrated in FIG. 3, the plurality of (for example, two) second filters 21 and 22. The second filters 21 and 22 are each, for example, a band pass filter with a pass band including a reception band that is the third frequency band. The third frequency band includes, as described above, both the frequency band of Band 8 and the frequency band of Band 26. The second filter 21 has a first input terminal and a first output terminal. The first input terminal of the second filter 21 is connected to a selection terminal 41 of the first switch 4. The first output terminal of the second filter 21 is connected to a selection terminal 611 of the second switch 61. The second filter 22 has a second input terminal and a second output terminal. The second input terminal of the second filter 22 is connected to a selection terminal 42 of the first switch 4. The second output terminal of the second filter 22 is connected to a selection terminal 612 of the second switch 61. The second filter 21 passes, for example, a reception signal (high-frequency signal) in the frequency band of Band 8. The second filter 22 passes, for example, a reception signal (high-frequency signal) in the frequency band of Band 26.

The third filter 3 is, for example, a band pass filter with a pass band including a reception band that is the fourth frequency band. The fourth frequency band includes, as described above, the frequency band of Band 12. The third filter 3 has an input terminal and an output terminal. The input terminal of the third filter 3 is connected to a selection terminal 44 of the first switch 4. The output terminal of the third filter 3 is connected to a selection terminal 622 of the second switch 62. Note that the fourth frequency band may include, for example, the frequency band of Band 13.

The first switch 4 has a common terminal 40 and a plurality of (for example, four) selection terminals 41 to 44. The common terminal 40 is connected to the antenna terminal 101 with the third matching circuit 83 interposed therebetween. The antenna terminal 101 is connected to the antenna 310. The selection terminal 41 is connected to the first input terminal of the second filter 21 of the filter device 2. The selection terminal 42 is connected to the second input terminal of the second filter 22 of the filter device 2. The selection terminal 43 is connected to the input terminal 111 of the first filter 1 with the first matching circuit 81 interposed therebetween. The selection terminal 44 is connected to the input terminal of the third filter 3. The first switch 4 is, for example, a switch that can connect at least one of the plurality of selection terminals 41 to 44 to the common terminal 40. That is, the first switch 4 is, for example, a switch that can make a point-to-point connection and a point-to-multipoint connection.

The first switch 4 is, for example, a switch integrated circuit (IC). The first switch 4 is controlled by, for example, the signal processing circuit 301. In this case, the first switch 4 switches the connection states between the plurality of selection terminals 41 to 44 and the common terminal 40 on the basis of a control signal from the RF signal processing circuit 302 of the signal processing circuit 301.

The second switch 61 has the common terminal 610 and the plurality of (for example, two) selection terminals 611 and 612. The common terminal 610 is connected to the first input terminal of the first low noise amplifier 51 with the fourth matching circuit 84 interposed therebetween. The selection terminal 611 is connected to the first output terminal of the second filter 21 of the filter device 2. The selection terminal 612 is connected to the second output terminal of the second filter 22 of the filter device 2.

The second switch 61 is, for example, a switch IC. The second switch 61 is controlled by, for example, the signal processing circuit 301. In this case, the second switch 61 switches the connection states between the plurality of selection terminals 611 and 612 and the common terminal 610 on the basis of a control signal from the RF signal processing circuit 302 of the signal processing circuit 301.

The second switch 62 has the common terminal 620 and the plurality of (for example, two) selection terminals 621 and 622. The common terminal 620 is connected to the second input terminal of the second low noise amplifier 52 with the fifth matching circuit 85 interposed therebetween. The selection terminal 621 is connected to the output terminal 112 of the first filter 1 with the second matching circuit 82 interposed therebetween. The selection terminal 622 is connected to the output terminal of the third filter 3.

The second switch 62 is, for example, a switch IC. The second switch 62 is controlled by, for example, the signal processing circuit 301. In this case, the second switch 62 switches the connection states between the plurality of selection terminals 621 and 622 and the common terminal 620 on the basis of a control signal from the RF signal processing circuit 302 of the signal processing circuit 301.

The third switch 7 has a plurality of (for example, three) first terminals 711 to 713 and a plurality of (for example, three) second terminals 721 to 723. The first terminal 711 is connected to the first output terminal of the first low noise amplifier 51. The first terminal 712 is connected to an output terminal of a first attenuator 91 of the power splitter 9. The first terminal 713 is connected to an output terminal of a second attenuator 92 of the power splitter 9. The second terminal 721 is connected to the signal output terminal 102. The second terminal 722 is connected to the signal output terminal 103. The second terminal 723 is connected to the signal output terminal 104. The signal output terminals 102 to 104 are connected to the signal processing circuit 301. The signal output terminals 102 to 104 are terminals for outputting a high-frequency signal (reception signal) from the low noise amplifiers 5 to an external circuit (for example, the signal processing circuit 301).

The third switch 7 is, for example, a switch IC. The third switch 7 is controlled by, for example, the signal processing circuit 301. In this case, the third switch 7 switches the connection states between the plurality of first terminals 711 to 713 and the plurality of second terminals 721 to 723 on the basis of a control signal from the RF signal processing circuit 302 of the signal processing circuit 301.

The first matching circuit 81 is provided on a signal path between the first filter 1 and the selection terminal 43 of the first switch 4. The first matching circuit 81 is a circuit for achieving the impedance matching between the first filter 1 and the first switch 4. The first matching circuit 81 includes, for example, a single inductor 811 (see FIG. 1). The first matching circuit 81 is, however, not limited to including the single inductor 811 and may include, for example, a plurality of inductors and a plurality of capacitors. The inductor 811 is shunt-connected between the ground and a signal path between the input terminal 111 of the first filter 1 and the selection terminal 43 of the first switch 4, for example.

The second matching circuit 82 is provided on a signal path between the first filter 1 and the selection terminal 621 of the second switch 62. The second matching circuit 82 is a circuit for achieving the impedance matching between the first filter 1 and the second switch 62. The second matching circuit 82 includes, for example, a single inductor 821 (see FIG. 1). The second matching circuit 82 is, however, not limited to including the single inductor 821 and may include, for example, a plurality of inductors and a plurality of capacitors. The inductor 821 is shunt-connected between the ground and a signal path between the output terminal 112 of the first filter 1 and the selection terminal 621 of the second switch 62, for example.

The third matching circuit 83 is provided on a signal path between the antenna terminal 101 and the common terminal 40 of the first switch 4. The third matching circuit 83 is a circuit for achieving the impedance matching between the antenna 310 and the first switch 4. The third matching circuit 83 includes, for example, a single inductor 831 (see FIG. 1). The third matching circuit 83 is, however, not limited to including the single inductor 831 and may include, for example, a plurality of inductors and a plurality of capacitors. The inductor 831 is shunt-connected between the ground and the signal path between the antenna terminal 101 and the common terminal 40 of the first switch 4, for example.

The fourth matching circuit 84 is provided on a signal path between the first input terminal of the first low noise amplifier 51 and the common terminal 610 of the second switch 61. The fourth matching circuit 84 is a circuit for achieving the impedance matching between the first low noise amplifier 51 and the second switch 61. The fourth matching circuit 84 includes a plurality of (for example, two) inductors 841 and 842 (see FIG. 1). The inductor 841 is connected in series to a signal path between the first low noise amplifier 51 and the second switch 61. The inductor 842 is shunt-connected between the above-mentioned signal path and the ground. The fourth matching circuit 84 may include, for example, a single inductor or three or more inductors and a plurality of capacitors.

The fifth matching circuit 85 is provided on a signal path between the second input terminal of the second low noise amplifier 52 and the common terminal 620 of the second switch 62. The fifth matching circuit 85 is a circuit for achieving the impedance matching between the second low noise amplifier 52 and the second switch 62. The fifth matching circuit 85 includes a plurality of (for example, two) inductors 851 and 852 (see FIG. 1). The inductor 851 is connected in series to a signal path between the second low noise amplifier 52 and the second switch 62. The inductor 852 is shunt-connected between the above-mentioned signal path and the ground. The fifth matching circuit 85 may include, for example, a single inductor or three or more inductors and a plurality of capacitors.

The power splitter 9 includes, as illustrated in FIG. 3, the first attenuator 91 and the second attenuator 92. The first attenuator 91 has a first input terminal and a first output terminal. The first input terminal of the first attenuator 91 is connected to the second output terminal of the second low noise amplifier 52. The first output terminal of the first attenuator 91 is connected to the first terminal 712 of the third switch 7. The second attenuator 92 has a second input terminal and a second output terminal. The second input terminal of the second attenuator 92 is connected to the second output terminal of the second low noise amplifier 52. The second output terminal of the second attenuator 92 is connected to the first terminal 713 of the third switch 7.

The first attenuator 91 is, for example, an attenuator configured to attenuate the second reception signal in the second frequency band. The second attenuator 92 is, for example, an attenuator configured to attenuate the first reception signal in the first frequency band. That is, in the high-frequency module 100 according to the present embodiment, the second reception signal is attenuated and only the passage of the first reception signal is allowed by the first attenuator 91 and the first reception signal is attenuated and only the passage of the second reception signal is allowed by the second attenuator 92. With this, the first reception signal and the second reception signal that have passed through the first filter 1 can be distributed.

(1.2) Structure of High-Frequency Module

Next, the structure of the high-frequency module 100 according to the present embodiment is described with reference to FIG. 1 and FIG. 2.

The high-frequency module 100 according to the present embodiment includes, as illustrated in FIG. 1 and FIG. 2, the mounting substrate 13, the plurality of circuit components, and the plurality of external connection terminals 10. Moreover, the high-frequency module 100 further includes a resin layer 14 and a shield layer 15.

The plurality of circuit components include the first filter 1, the filter device 2, the third filter 3, the plurality of low noise amplifiers 5, and the plurality of matching circuits 8, which have been described above. Moreover, the plurality of circuit components further include the first switch 4, the plurality of second switches 6, the third switch 7, and the power splitter 9, which have been described above.

The mounting substrate 13 has the first principal surface 131 and the second principal surface 132 that face each other in the thickness direction D1 of the mounting substrate 13. The mounting substrate 13 is, for example, a multilayer substrate including a plurality of dielectric layers and a plurality of conductive layers. The plurality of dielectric layers and the plurality of conductive layers are stacked in the thickness direction D1 of the mounting substrate 13. The plurality of conductive layers are formed in a predetermined pattern determined for each layer. The plurality of conductive layers each includes one or a plurality of conductor portions in a plane orthogonal to the thickness direction D1 of the mounting substrate 13. The material of each conductive layer is, for example, copper. The plurality of conductive layers include a ground layer. In the high-frequency module 100, the plurality of ground terminals 105 (see FIG. 2) are electrically connected to the ground layer with via conductors included in the mounting substrate 13 interposed therebetween, for example. The mounting substrate 13 is, for example, a low temperature co-fired ceramics (LTCC) substrate. The mounting substrate 13 is not limited to an LTCC substrate and may be, for example, a printed wiring board, a high temperature co-fired ceramics (HTCC) substrate, or a resin multilayer substrate.

Further, the mounting substrate 13 is not limited to an LTCC substrate and may be, for example, a wiring structure. The wiring structure is, for example, a multilayer structure. The multilayer structure includes at least one insulating layer and at least one conductive layer. The insulating layer is formed in a predetermined pattern. When a plurality of insulating layers are used, the plurality of insulating layers are formed in a predetermined pattern determined for each layer. The conductive layer is formed in a predetermined pattern different from the predetermined pattern of the insulating layer. When a plurality of conductive layers are used, the plurality of conductive layers are formed in a predetermined pattern determined for each layer. The conductive layer may include one or a plurality of rewiring portions. In the wiring structure, of two surfaces facing each other in the thickness direction of the multilayer structure, a first surface is the first principal surface 131 of the mounting substrate 13 and a second surface is the second principal surface 132 of the mounting substrate 13. The wiring structure may be, for example, an interposer. The interposer may be an interposer using a silicon substrate or a substrate including multiple layers.

The first principal surface 131 and the second principal surface 132 of the mounting substrate 13 are separated from each other in the thickness direction D1 of the mounting substrate 13 and intersect the thickness direction D1 of the mounting substrate 13. Although the first principal surface 131 of the mounting substrate 13 is orthogonal to the thickness direction D1 of the mounting substrate 13, for example, the first principal surface 131 may include, for example, the side surface of a conductor portion or the like as a surface not orthogonal to the thickness direction D1. Further, although the second principal surface 132 of the mounting substrate 13 is orthogonal to the thickness direction D1 of the mounting substrate 13, for example, the second principal surface 132 may include, for example, the side surface of a conductor portion or the like as a surface not orthogonal to the thickness direction D1. Further, the first principal surface 131 and the second principal surface 132 of the mounting substrate 13 may have fine recesses and projections, recesses, or projections. For example, when the first principal surface 131 of the mounting substrate 13 has recesses, the inner surfaces of the recesses are included in the first principal surface 131. In the plan view from the thickness direction D1 of the mounting substrate 13, the mounting substrate 13 has a rectangular shape. The mounting substrate 13 is, however, not limited to this and may have, for example, a square shape.

In the high-frequency module 100 according to the present embodiment, the plurality of circuit components are mounted on the first principal surface 131 or the second principal surface 132 of the mounting substrate 13. "A circuit component is mounted on the first principal surface 131 or the second principal surface 132 of the mounting substrate 13" herein includes a case where the circuit component is placed on (mechanically connected to) the first principal surface 131 or the second principal surface 132 of the mounting substrate 13 and a case where the circuit component is electrically connected to (an appropriate conductor portion of) the mounting substrate 13. Thus, in the high-frequency module 100, the plurality of circuit components are placed on the first principal surface 131 or the second principal surface 132 of the mounting substrate 13. Note that the high-frequency module 100 may include, in addition to the plurality of circuit components mounted on the mounting substrate 13, circuit elements provided in the mounting substrate 13.

In the high-frequency module 100 according to the present embodiment, the first filter 1, the filter device 2, the third filter 3, the first switch 4, and the plurality of matching circuits 8 are mounted on the first principal surface 131 of the mounting substrate 13. Further, in the high-frequency module 100 according to the present embodiment, an IC chip 11 including the plurality of low noise amplifiers 5, the plurality of second switches 6, the third switch 7, and the power splitter 9 is mounted on the first principal surface 131 of the mounting substrate 13. Moreover, in the high-frequency module 100 according to the present embodiment, a plurality of (for example, two) power capacitors 12 are mounted on the first principal surface 131 of the mounting substrate 13.

The first filter 1, the second filters 21 and 22 included in the filter device 2, and the third filter 3 are each, for example, a ladder filter. The first filter 1, the second filters 21 and 22, and the third filter 3 each includes a plurality of (for example, four) series arm resonators and a plurality of (for example, three) parallel arm resonators. The first filter 1, the second filters 21 and 22, and the third filter 3 are each, for example, an acoustic wave filter. The acoustic wave filter includes pluralities of series arm resonators and parallel arm resonators each including an acoustic wave resonator. The acoustic wave filter is, for example, a surface acoustic wave filter using surface acoustic waves. In the surface acoustic wave filter, the plurality of series arm resonators and the plurality of parallel arm resonators are each, for example, a surface acoustic wave (SAW) resonator. That is, in the high-frequency module 100 according to the present embodiment, the first filter 1, the second filters 21 and 22, and the third filter 3 are each a SAW filter.

In the plan view from the thickness direction D1 of the mounting substrate 13, the outer peripheral shape of each of the first filter 1, the second filters 21 and 22, and the third filter 3 is a quadrilateral shape. Further, in the plan view from the thickness direction D1 of the mounting substrate 13, the first filter 1 is larger than the second filters 21 and 22 and the third filter 3. Note that how the first filter 1 and the like are placed on the first principal surface 131 of the mounting substrate 13 is described in the section "(1.3) Layout of High-Frequency Module".

The first matching circuit 81 includes, as described above, the single inductor 811 (see FIG. 1 and FIG. 2). The inductor 811 is, for example, a chip inductor. The inductor 811 is mounted on the first principal surface 131 of the mounting substrate 13, for example. In the plan view from the thickness direction D1 of the mounting substrate 13, the outer edge of the inductor 811 has a quadrilateral shape. The first matching circuit 81 may include an inner-layer inductor provided in the mounting substrate 13.

The second matching circuit 82 includes, as described above, the single inductor 821 (see FIG. 1). The inductor 821 is, for example, a chip inductor. The inductor 821 is mounted on the first principal surface 131 of the mounting substrate 13, for example. In the plan view from the thickness direction D1 of the mounting substrate 13, the outer edge of the inductor 821 has a quadrilateral shape. The second matching circuit 82 may include an inner-layer inductor provided in the mounting substrate 13.

The third matching circuit 83 includes, as described above, the single inductor 831 (see FIG. 1). The inductor 831 is, for example, a chip inductor. The inductor 831 is mounted on the first principal surface 131 of the mounting substrate 13, for example. In the plan view from the thickness direction D1 of the mounting substrate 13, the outer edge of the inductor 831 has a quadrilateral shape. The third matching circuit 83 may include an inner-layer inductor provided in the mounting substrate 13.

The fourth matching circuit 84 includes, as described above, the plurality of inductors 841 and 842 (see FIG. 1). The plurality of inductors 841 and 842 are each, for example, a chip inductor. The plurality of inductors 841 and 842 are each mounted on the first principal surface 131 of the mounting substrate 13, for example. In the plan view from the thickness direction D1 of the mounting substrate 13, the outer edge of each of the plurality of inductors 841 and 842 has a quadrilateral shape. The fourth matching circuit 84 may include an inner-layer inductor provided in the mounting substrate 13.

The fifth matching circuit 85 includes, as described above, the plurality of inductors 851 and 852 (see FIG. 1). The plurality of inductors 851 and 852 are each, for example, a chip inductor. The plurality of inductors 851 and 852 are each mounted on the first principal surface 131 of the mounting substrate 13, for example. In the plan view from the thickness direction D1 of the mounting substrate 13, the outer edge of each of the plurality of inductors 851 and 852 has a quadrilateral shape. The fifth matching circuit 85 may include an inner-layer inductor provided in the mounting substrate 13.

In the high-frequency module 100 according to the present embodiment, the IC chip 11 including the plurality of low noise amplifiers 5, the plurality of second switches 6, the third switch 7, and the power splitter 9 is mounted on the first principal surface 131 of the mounting substrate 13. In the plan view from the thickness direction D1 of the mounting substrate 13, the outer edge of the IC chip 11 has a quadrilateral shape. An amplifier transistor included in each of the plurality of low noise amplifiers 5 is a field effect transistor. The amplifier transistor is, however, not limited to this and may be, for example, a bipolar transistor. The IC chip 11 is, for example, a Si-based IC chip, but the IC chip 11 is not limited to this.

The plurality of external connection terminals 10 are placed on the second principal surface 132 of the mounting substrate 13. "The external connection terminal 10 is placed on the second principal surface 132 of the mounting substrate 13" includes a case where the external connection terminal 10 is mechanically connected to the second principal surface 132 of the mounting substrate 13 and a case where the external connection terminal 10 is electrically connected to (an appropriate conductor portion of) the mounting substrate 13. The material of the plurality of external connection terminals 10 is, for example, a metal (for example, copper or a copper alloy). The plurality of external connection terminals 10 are joined to the conductor portion of the mounting substrate 13 with solder, for example. The present disclosure is, however, not limited to this, and the plurality of external connection terminals 10 may be joined by using a conductive adhesive (for example, a conductive paste) or directly, for example.

The plurality of external connection terminals 10 include the plurality of ground terminals 105 in addition to the antenna terminal 101 and the three signal output terminals 102 to 104, which have been described above. The plurality of ground terminals 105 are electrically connected to the ground layer of the mounting substrate 13 as described above. The ground layer is the circuit ground of the high-frequency module 100. The plurality of circuit components include circuit components electrically connected to the ground layer.

The resin layer 14 covers, on the first principal surface 131 side of the mounting substrate 13, each of the plurality of circuit components mounted on the first principal surface 131 of the mounting substrate 13. More specifically, the resin layer 14 covers the outer peripheral surface of each of the plurality of circuit components. Further, the resin layer 14 covers the principal surface on the opposite side of the mounting substrate 13 side of each of the plurality of circuit components. The resin layer 14 includes a resin (for example, an epoxy resin). The resin layer 14 may include a filler in addition to the resin.

The shield layer 15 has a first portion 151 and a second portion 152. The first portion 151 is a portion covering a principal surface 141 on the opposite side of the mounting substrate 13 side of the resin layer 14. The second portion 152 is a portion covering an outer peripheral surface 142 of the resin layer 14 and an outer peripheral surface 133 of the mounting substrate 13. The shield layer 15 is conductive. The shield layer 15 has a multilayer structure including a plurality of metal layers stacked. The shield layer 15 is, however, not limited to a multilayer structure and may include a single metal layer. The metal layer includes one or a plurality of types of metals. The shield layer 15 is in contact with the ground layer included in the mounting substrate 13. With this, the potential of the shield layer 15 can be the same as the potential of the ground layer. The shield layer 15 is formed by, for example, sputtering the principal surface 141 of the resin layer 14, the outer peripheral surface 142 of the resin layer 14, and the outer peripheral surface 133 of the mounting substrate 13.

(1.3) Layout of High-Frequency Module

Next, the layout of the circuit components of the high-frequency module 100 according to the present embodiment is described with reference to FIG. 1 and FIG. 2.

In the high-frequency module 100, as illustrated in FIG. 1, the first filter 1 is located between the filter device 2 (second filters 21 and 22) and the third filter 3 in the plan view from the thickness direction D1 of the mounting substrate 13. In other words, the first filter 1, the second filters 21 and 22, and the third filter 3 are arranged in the order of the second filters 21 and 22, the first filter 1, and the third filter 3 in a width direction D3 of the mounting substrate 13 intersecting the thickness direction D1 of the mounting substrate 13. With this, the first filter 1 can be mounted at a position closer to the center of the first principal surface 131 of the mounting substrate 13. "The first filter 1 is located between the second filters 21 and 22 and the third filter 3" herein means that at least one of a plurality of line segments connecting optional points in the second filters 21 and 22 to optional points in the third filter 3 passes through the first filter 1. Here, with regard to a plate-like member such as the mounting substrate 13, the warp of the mounting substrate 13 tends to be larger at the outer side portion of the mounting substrate 13 than at the center thereof. Thus, with the first filter 1 mounted at the position closer to the center of the first principal surface 131 of the mounting substrate 13, the effect of the coplanarity of the mounting substrate 13 on the first filter 1 can be reduced. As a result, the risk that a bump for connecting the first filter 1 to the mounting substrate 13 is broken can be reduced.

Further, in the high-frequency module 100, as illustrated in FIG. 1, the first filter 1 is adjacent to the first switch 4 in the plan view from the thickness direction D1 of the mounting substrate 13. "The first filter 1 is adjacent to the first switch 4" herein means that, in the plan view from the thickness direction D1 of the mounting substrate 13, the first filter 1 and the first switch 4 are adjacent to each other without necessarily any circuit component provided between the first filter 1 and the first switch 4 in both a length direction D2 and the width direction D3 of the mounting substrate 13. Further, "the first filter 1 and the first switch 4 are adjacent to each other" herein includes a case where at least a portion of the first filter 1 overlaps the first switch 4 in the plan view from the thickness direction D1 of the mounting substrate 13. Moreover, in the high-frequency module 100, the second filters 21 and 22 (filter device 2) are adjacent to the first switch 4 in the plan view from the thickness direction D1 of the mounting substrate 13. Further, in the high-frequency module 100, the first filter 1 is adjacent to the IC chip 11 in the plan view from the thickness direction D1 of the mounting substrate 13.

With the first filter 1 being adjacent to the first switch 4, the first wire W1 for connecting the first filter 1 to the first switch 4 can be short. Further, with the second filters 21 and 22 being adjacent to the first switch 4, the second wire W2 for connecting the second filters 21 and 22 to the first switch 4 can be short. Meanwhile, as illustrated in FIG. 1, since the third filter 3 is not adjacent to the first switch 4, the third wire W3 for connecting the third filter 3 to the first switch 4 cannot be short. In this way, with the first filter 1 and the second filters 21 and 22 being adjacent to the first switch 4, the first wire W1 and the second wire W2 can be shorter than the third wire W3.

Here, an impedance in the frequency band of Band 28 of the first filter 1 is assumed to be, for example, 50Ω (characteristic impedance). In this case, the impedance in the frequency band of Band 28 of the first filter 1 changes due to a parasitic inductance generated in the first wire W1 for connecting the first filter 1 to the first switch 4 and a parasitic capacitance generated between the first wire W1 and the ground. More specifically, the impedance in the frequency band of Band 28 of the first filter 1 is shifted to the inductive side due to the parasitic inductance and shifted to the capacitive side due to the parasitic capacitance. In this way, the larger the length of the first wire W1, the larger the parasitic inductance and parasitic capacitance. As a result, the impedance in the frequency band of Band 28 of the first filter 1 largely deviates from 50Ω. Thus, the first wire W1 can be as short as possible. With this, the impedance in the frequency band of Band 28 of the first filter 1 is less likely to be shifted to the inductive side or the capacitive side, with the result that impedance matching is easy to achieve.

Next, a case where carrier aggregation (simultaneous communication) using Band 28 included in the first frequency band and Band 8 included in the third frequency band is performed is described. An impedance in Band 28 when seen from the Band 8 side can be infinity. In this case, the impedance in Band 28 changes due to a parasitic inductance generated in the second wire W2 for connecting the second filter 21 to the first switch 4 and a parasitic capacitance generated between the second wire W2 and the ground. More specifically, the impedance in Band 28 is shifted to the inductive side due to the parasitic inductance and shifted to the capacitive side due to the parasitic capacitance. In this way, the larger the length of the second wire W2, the larger the parasitic inductance and parasitic capacitance. As a result, the impedance in Band 28 is shifted from infinity to the low impedance side. Thus, the second wire W2 also can be as short as possible. With this, the impedance in Band 28 is less likely to be shifted to the inductive side or the capacitive side, with the result that the path including the first filter 1 can be isolated from the path including the second filter 21. Thus, a degradation of the characteristics of the second filter 21 can be reduced.

Further, in the high-frequency module 100, as illustrated in FIG. 1, the first filter 1 is mounted in the orientation that makes the input terminal 111 of the first filter 1 be located on the first switch 4 side and the output terminal 112 of the first filter 1 be located on the IC chip 11 side in the plan view from the thickness direction D1 of the mounting substrate 13. Here, a case where the first filter 1 is rotated 90 degrees counterclockwise in FIG. 1 is assumed. In this case, as compared to the case where the first filter 1 is mounted in the orientation illustrated in FIG. 1, the distance from the input terminal 111 of the first filter 1 to the IC chip 11 is short. With this, there is a risk that a reception signal from the first switch 4 hops to the second switch 6 of the IC chip 11 without necessarily passing through the first filter 1. In contrast to this, with the first filter 1 mounted in the orientation illustrated in FIG. 1, a reception signal from the first switch 4 can be prevented from hopping to the second switch 6 of the IC chip 11 without necessarily passing through the first filter 1.

Further, in the high-frequency module 100, as illustrated in FIG. 1, the first switch 4 and the IC chip 11 are mounted at diagonal positions on the first principal surface 131 of the mounting substrate 13. With this, in the plan view from the thickness direction D1 of the mounting substrate 13, a distance L1 between a center c1 of the IC chip 11 and a center c2 of the first switch 4 can be long. As a result, the IC chip 11 is easily isolated from the first switch 4.

Further, in the high-frequency module 100, as illustrated in FIG. 1, the plurality of low noise amplifiers 5, the plurality of second switches 6, the third switch 7, and the power splitter 9, which are included in the IC chip 11, are arranged in the order of the plurality of second switches 6, the plurality of low noise amplifiers 5, the power splitter 9, and the third switch 7 from the first filter 1 side in the length direction (one direction) D2 of the mounting substrate 13 intersecting the thickness direction D1 of the mounting substrate 13. That is, in the high-frequency module 100, in the length direction (one direction) D2 of the mounting substrate 13 intersecting the thickness direction D1 of the mounting substrate 13, the first filter 1, the second switch 62, the second low noise amplifier 52, the power splitter 9, and the third switch 7 are arranged in this order. With this, the first filter 1 can be prevented from being coupled to the internal circuit of the IC chip 11.

Further, in the high-frequency module 100, as illustrated in FIG. 2, the first filter 1 is mounted at the position closer to the center of the first principal surface 131 of the mounting substrate 13 so that the distance between the first filter 1 and the second portion 152 of the shield layer 15 in the width direction D3 of the mounting substrate 13 can be long, with the result that a parasitic capacitance between the first filter 1 and the second portion 152 of the shield layer 15 can be reduced. Further, the distance between the first filter 1 and the second portion 152 of the shield layer 15 in the length direction D2 of the mounting substrate 13 can also be long, with the result that a parasitic capacitance between the first filter 1 and the second portion 152 of the shield layer 15 can be reduced.

(2) Effects (2.1) High-Frequency Module

The high-frequency module 100 according to the present embodiment includes the mounting substrate 13, the first filter 1, the second filters 21 and 22 (filter device 2), the third filter 3, the antenna terminal 101, and the first switch 4. The mounting substrate 13 has the first principal surface 131 and the second principal surface 132 that face each other. The first filter 1 is mounted on the first principal surface 131 of the mounting substrate 13 and passes the first high-frequency signal (first reception signal) in the first frequency band and the second high-frequency signal (second reception signal) in the second frequency band with a higher frequency than the first frequency band. The second filters 21 and 22 are mounted on the first principal surface 131 of the mounting substrate 13 and pass the third high-frequency signal (third reception signal) in the third frequency band different from the first frequency band and the second frequency band. The third filter 3 is mounted on the first principal surface 131 of the mounting substrate 13 and passes the fourth high-frequency signal (fourth reception signal) in the fourth frequency band different from the first frequency band, the second frequency band, and the third frequency band. The first switch 4 is capable of simultaneously connecting the first filter 1 and the second filters 21 and 22 to the antenna terminal 101. The first frequency band and the second frequency band are bands adjacent to each other or bands with frequencies that overlap each other in part. In the plan view from the thickness direction D1 of the mounting substrate 13, the first filter 1 is larger than the second filters 21 and 22 and the third filter 3 and located between the second filters 21 and 22 and the third filter 3. The first wire W1 for connecting the first filter 1 to the first switch 4 and the second wire W2 for connecting the second filters 21 and 22 to the first switch 4 are each shorter than the third wire W3 for connecting the third filter 3 to the first switch 4.

In the high-frequency module 100 according to the present embodiment, as described above, the first filter 1 is located between the second filters 21 and 22 and the third filter 3 in the plan view from the thickness direction D1 of the mounting substrate 13. With this, the first filter 1 is mounted at the position closer to the center of the first principal surface 131 of the mounting substrate 13. Thus, the effect of the coplanarity of the mounting substrate 13 can be reduced as compared to a case where the first filter 1 is mounted at a position closer to the outer side portion of the first principal surface 131 of the mounting substrate 13. With this, a degradation of the filter characteristics of the first filter 1 can be reduced as compared to a case where the first filter 1 is mounted at a position closer to the outer side portion of the first principal surface 131 of the mounting substrate 13.

Further, in the high-frequency module 100 according to the present embodiment, as described above, the first filter 1 can pass the first high-frequency signal (first reception signal) in the first frequency band and the second high-frequency signal (second reception signal) in the second frequency band and thus has a wider bandwidth than a filter that can only pass a high-frequency signal in a single frequency band. Thus, in this case, impedance matching is difficult to achieve. However, in the high-frequency module 100 according to the present embodiment, as described above, the first wire W1 and the second wire W2 are each shorter than the third wire W3. With this, a parasitic capacitance due to the first wire W1 and the second wire W2 can be reduced, with the result that a degradation of the characteristics of the first filter 1 in a case where a communication only using the first filter 1 (including a case where the first reception signal and the second reception signal are simultaneously received) is performed and a case where a simultaneous communication using the first filter 1 and the second filters 21 and 22 is performed can be reduced. That is, with the high-frequency module 100 according to the present embodiment, the first filter 1 can be prevented from being affected by the coplanarity of the mounting substrate 13 and a degradation of the characteristics of the first filter 1 can be reduced.

Further, in the high-frequency module 100 according to the present embodiment, as described above, the first filter 1 is placed at the position closer to the center of the first principal surface 131 of the mounting substrate 13 and the distance between the first filter 1 and the second portion 152 of the shield layer 15 is thus long in each of the length direction D2 and the width direction D3 of the mounting substrate 13 so that a parasitic capacitance between the first filter 1 and the shield layer 15 can be reduced.

Further, in the high-frequency module 100 according to the present embodiment, the first switch 4 and the IC chip 11 are mounted at the diagonal positions on the first principal surface 131 of the mounting substrate 13. With this, the first switch 4 is easily isolated from the IC chip 11.

(2.2) Communication Device

The communication device 300 according to the present embodiment includes the high-frequency module 100 described above, and the signal processing circuit 301. The signal processing circuit 301 is connected to the high-frequency module 100.

The communication device 300 according to the present embodiment includes the high-frequency module 100 so that the first filter 1 can be prevented from being affected by the coplanarity of the mounting substrate 13 and a degradation of the characteristics of the first filter 1 can be reduced.

Here, the plurality of circuit components of the signal processing circuit 301 may be mounted on the circuit board described above or a circuit board (second circuit board) different from the circuit board (first circuit board) having the high-frequency module 100 mounted thereon, for example.

(3) Modification (3.1) Modification 1

A high-frequency module 100*a* according to Modification 1 is described with reference to FIG. 4. Components of the high-frequency module 100*a* according to Modification 1 similar to those of the high-frequency module 100 according to the embodiment described above are denoted by the same reference characters, and the description thereof is omitted. Note that the circuit configuration of the high-frequency module 100*a* is similar to the circuit configuration of the high-frequency module 100 according to the embodiment described above with reference to FIG. 3.

The high-frequency module 100*a* according to Modification 1 is different from the high-frequency module 100 according to the embodiment described above in that the IC chip 11 is mounted at a position closer to the corner of the first principal surface 131 of the mounting substrate 13. With this, the distance L1 between the center c1 of the IC chip 11 and the center c2 of the first switch 4 can be longer, with the result that the IC chip 11 is more easily isolated from the first switch 4.

(3.2) Other Modifications

The embodiment described above is merely one of various embodiments of the present disclosure. The embodiment described above can be modified in various manners depending on a design choice or the like.

Although the first frequency band includes the frequency band of Band 28, the second frequency band includes the frequency band of Band 20, and the third frequency band includes the frequency band of Band 8 and the frequency band of Band 26 in the embodiment described above, the present disclosure is not limited to this. The first frequency band is only required to include the frequency band of Band 28 or the frequency band of n28, the second frequency band is only required to include the frequency band of Band 20 or the frequency band of n20, and the third frequency band is only required to include at least one of the frequency band of Band 8, the frequency band of Band 20, and the frequency band of n8.

Although the shield layer 15 is formed by vacuum deposition such as sputtering in the embodiment described above, for example, the shield layer 15 may be formed by spin coating.

Although the first frequency band and the second frequency band are bands with frequencies that overlap each other in part in the embodiment described above, for example, the first frequency band and the second frequency band may be bands adjacent to each other without necessarily any partial frequency overlap. "Bands adjacent to each other" herein means two bands between which a frequency band defined by the 3GPP LTE standard does not exist.

Although the first filter 1, the second filters 21 and 22, and the third filter 3 are each an acoustic wave filter using surface acoustic waves in the embodiment described above, the first filter 1, the second filters 21 and 22, and the third filter 3 are not limited to this and may each be, for example, an acoustic wave filter using boundary acoustic waves, plate waves, or the like. Further, the first filter 1, the second filters 21 and 22, and the third filter 3 may each be an LC filter.

Although the plurality of series arm resonators and the plurality of parallel arm resonators are each a SAW resonator in the embodiment described above, the plurality of series arm resonators and the plurality of parallel arm resonators may each be, for example, a bulk acoustic wave (BAW) resonator.

Although the first filter 1, the second filters 21 and 22, and the third filter 3 are each a reception filter in the embodiment described above, for example, at least one of the first filter 1, the second filters 21 and 22, and the third filter 3 may be a transmission filter. As an example, when the first filter 1 is a transmission filter, the first high-frequency signal and the second high-frequency signal are each a transmission signal.

Aspects

The following aspects are herein disclosed.

A high-frequency module (100; 100*a*) according to a first aspect includes a mounting substrate (13), a first filter (1), a second filter (21 or 22), a third filter (3), an antenna terminal (101), and a switch (4). The mounting substrate (13) has a first principal surface (131) and a second principal surface (132) that face each other. The first filter (1) is mounted on the first principal surface (131) of the mounting substrate (13) and passes a first high-frequency signal in a first frequency band and a second high-frequency signal in a second frequency band with a higher frequency than the first frequency band. The second filter (21 or 22) is mounted on the first principal surface (131) of the mounting substrate (13) and passes a third high-frequency signal in a third frequency band different from the first frequency band and the second frequency band. The third filter (3) is mounted on the first principal surface (131) of the mounting substrate (13) and passes a fourth high-frequency signal in a fourth frequency band different from the first frequency band, the second frequency band, and the third frequency band. The switch (4) is capable of simultaneously connecting the first filter (1) and the second filter (21 or 22) to the antenna terminal (101). The first frequency band and the second frequency band are bands adjacent to each other or bands with frequencies that overlap each other in part. In a plan view from a thickness direction (D1) of the mounting substrate (13), the first filter (1) is larger than the second filter (21 or 22) and the third filter (3) and located between the second filter (21 or 22) and the third filter (3). A first wire (W1) for connecting the first filter (1) to the switch (4) and a second wire (W2) for connecting the second filter (21 or 22) to the switch (4) are each shorter than a third wire (W3) for connecting the third filter (3) to the switch (4).

According to this aspect, the first filter (1) can be prevented from being affected by the coplanarity of the mounting substrate (13) and a degradation of the characteristics of the first filter (1) can be reduced.

In the high-frequency module (100; 100*a*) according to a second aspect based on the first aspect, the first high-frequency signal, the second high-frequency signal, the third high-frequency signal, and the fourth high-frequency signal are each a reception signal.

In the high-frequency module (100; 100*a*) according to a third aspect based on the first or second aspect, the first filter (1) is adjacent to the switch (4) in the plan view from the thickness direction (D1) of the mounting substrate (13).

According to this aspect, a degradation of the characteristics of the first filter (1) can be reduced.

In the high-frequency module (100; 100*a*) according to a fourth aspect based on any one of the first to third aspects, the second filter (21 or 22) is adjacent to the switch (4) in the plan view from the thickness direction (D1) of the mounting substrate (13).

According to this aspect, a degradation of the characteristics of the first filter (1) when a simultaneous communication using the first filter (1) and the second filter (21 or 22) is performed can be reduced.

The high-frequency module (100; 100*a*) according to a fifth aspect based on any one of the first to fourth aspects further includes a resin layer (14) and a shield layer (15). The resin layer (14) covers, on a side of the first principal surface (131) of the mounting substrate (13), at least a portion of the first filter (1), at least a portion of the second filter (21 or 22), at least a portion of the third filter (3), and at least a portion of the switch (4). The shield layer (15) covers at least a portion of the resin layer (14).

According to this aspect, a parasitic capacitance between the first filter (1) and the shield layer (15) can be reduced.

In the high-frequency module (100; 100*a*) according to a sixth aspect based on any one of the first to fifth aspects, the first filter (1), the second filter (21 or 22), and the third filter (3) are each a SAW filter.

The high-frequency module (100; 100*a*) according to a seventh aspect based on any one of the first to sixth aspects further includes at least one low noise amplifier (5). The at least one low noise amplifier (5) amplifies a first reception signal that serves as the first high-frequency signal, a second reception signal that serves as the second high-frequency signal, a third reception signal that serves as the third high-frequency signal, and a fourth reception signal that serves as the fourth high-frequency signal.

According to this aspect, the first reception signal, the second reception signal, the third reception signal, and the fourth reception signal can be amplified.

The high-frequency module (100; 100*a*) according to an eighth aspect based on the seventh aspect includes an IC chip (11). The IC chip (11) includes the low noise amplifier (5). The mounting substrate (13) has a rectangular shape in the plan view from the thickness direction (D1) of the mounting substrate (13). The IC chip (11) and the switch (4) are mounted at diagonal positions on the first principal surface (131) of the mounting substrate (13).

According to this aspect, the IC chip (11) is easily isolated from the switch (4).

In the high-frequency module (100; 100*a*) according to a ninth aspect based on the eighth aspect, the IC chip (11) further includes a power splitter (9), a second switch (6), and a third switch (7). The power splitter (9) distributes the first reception signal and the second reception signal amplified by the low noise amplifier (5). The second switch (6) is a switch different from a first switch (4) that serves as the switch (4) and connected to an input side of the low noise amplifier (5). The third switch (7) is connected to an output side of the low noise amplifier (5). The first filter (1), the second switch (6), the low noise amplifier (5), the power splitter (9), and the third switch (7) are arranged in this order in one direction (D2) that intersects the thickness direction (D1) of the mounting substrate (13).

According to this aspect, as compared to a case where the second switch (6), the low noise amplifier (5), the power splitter (9), and the third switch (7) are arranged differently, the first filter (1) can be prevented from being coupled to the internal component of the IC chip (11).

In the high-frequency module (100; 100*a*) according to a tenth aspect based on the eighth or ninth aspect, the first filter (1) has an input terminal (111) and an output terminal (112). The input terminal (111) receives the first reception signal and the second reception signal input from the switch (4). The output terminal (112) outputs the first reception signal and the second reception signal to the IC chip (11). The first filter (1) is mounted on the first principal surface (131) of the mounting substrate (13) such that the input terminal (111) is located on a side of the switch (4) and the output terminal (112) is located on a side of the IC chip (11).

According to this aspect, the first reception signal and the second reception signal from the switch (4) can be prevented from hopping to the IC chip (11) without necessarily passing through the first filter (1).

In the high-frequency module (100; 100*a*) according to an eleventh aspect based on any one of the first to tenth aspects, the first frequency band includes a frequency band of Band 28 or a frequency band of n28. The second frequency band includes a frequency band of Band 20 or a frequency band of n20.

According to this aspect, a simultaneous communication using the first frequency band and the second frequency band can be performed.

In the high-frequency module (100; 100*a*) according to a twelfth aspect based on the eleventh aspect, the third frequency band includes at least one of a frequency band of Band 8, a frequency band of Band 26, and a frequency band of n8.

According to this aspect, a simultaneous communication using one of the first frequency band and the second frequency band and the third frequency band can be performed.

The high-frequency module (100; 100*a*) according to a thirteenth aspect based on any one of the first to twelfth aspects further includes a power splitter (9). The power splitter (9) distributes the first high-frequency signal and the second high-frequency signal that have passed through the first filter (1).

According to this aspect, the first high-frequency signal and the second high-frequency signal can be distributed.

A communication device (300) according to a fourteenth aspect includes the high-frequency module (100) of the first to thirteenth aspects, and a signal processing circuit (301). The signal processing circuit (301) is connected to the high-frequency module (100).

According to this aspect, the first filter (1) can be prevented from being affected by the coplanarity of the mounting substrate (13) and a degradation of the characteristics of the first filter (1) can be reduced.

REFERENCE SIGNS LIST

1 first filter
2 filter device
3 third filter
4 first switch (switch)
5 low noise amplifier
7 third switch
8 matching circuit
9 power splitter
10 external connection terminal
11 IC chip
12 power capacitor
13 mounting substrate
14 resin layer
15 shield layer
21, 22 second filter
40 common terminal
41, 42, 43, 44 selection terminal
51 first low noise amplifier
52 second low noise amplifier
61, 62 second switch
71 first terminal
72 second terminal
81 first matching circuit
82 second matching circuit
83 third matching circuit
84 fourth matching circuit
85 fifth matching circuit
91 first attenuator
92 second attenuator
100, 100a high-frequency module
101 antenna terminal
102, 103, 104 signal output terminal
105 ground terminal
111 input terminal
112 output terminal
131 first principal surface
132 second principal surface
133 outer peripheral surface
141 principal surface
142 outer peripheral surface
151 first portion
152 second portion
300 communication device
301 signal processing circuit
302 RF signal processing circuit
303 baseband signal processing circuit
310 antenna
610 common terminal
611, 612 selection terminal
620 common terminal
621, 622 selection terminal
711, 712, 713 first terminal
721, 722, 723 second terminal
811, 821, 831, 841, 842, 851, 852 inductor
c1 center of IC chip
c2 center of first switch
D1 thickness direction
D2 length direction (one direction)
D3 width direction
L1 distance
W1 first wire
W2 second wire
W3 third wire

The invention claimed is:

1. A high-frequency module comprising:
a mounting substrate comprising a first principal surface and a second principal surface that face each other;
a first filter on the first principal surface of the mounting substrate and configured to pass a first high-frequency signal in a first frequency band and a second high-frequency signal in a second frequency band, the second frequency band comprising a higher frequency than the first frequency band;
a second filter on the first principal surface of the mounting substrate and configured to pass a third high-frequency signal in a third frequency band, the third frequency band being different from the first frequency band and the second frequency band;
a third filter on the first principal surface of the mounting substrate and configured to pass a fourth high-frequency signal in a fourth frequency band, the fourth frequency band being different from the first frequency band, the second frequency band, and the third frequency band;
an antenna terminal; and
a switch configured to selectively connect the first filter and the second filter to the antenna terminal, wherein
the first frequency band and the second frequency band are bands adjacent to each other or bands with frequencies that overlap each other in part,
in a plan view from a thickness direction of the mounting substrate, the first filter is larger than the second filter and the third filter and is between the second filter and the third filter, and
a first wire configured to connect the first filter to the switch and a second wire configured to connect the second filter to the switch are each shorter than a third wire configured to connect the third filter to the switch.

2. The high-frequency module according to claim 1, wherein
the first high-frequency signal, the second high-frequency signal, the third high-frequency signal, and the fourth high-frequency signal each comprise a reception signal.

3. The high-frequency module according to claim 1, wherein
the first filter is adjacent to the switch in the plan view from the thickness direction of the mounting substrate.

4. The high-frequency module according to claim 1, wherein
the second filter is adjacent to the switch in the plan view from the thickness direction of the mounting substrate.

5. The high-frequency module according to claim 1, further comprising:
a resin layer configured to cover, on a side of the first principal surface of the mounting substrate, at least a portion of the first filter, at least a portion of the second filter, at least a portion of the third filter, and at least a portion of the switch; and
a shield layer configured to cover at least a portion of the resin layer.

6. The high-frequency module according to claim 1, wherein
the first filter, the second filter, and the third filter each comprise a surface acoustic wave (SAW) filter.

7. The high-frequency module according to claim 1, further comprising:
at least one low noise amplifier configured to amplify a first reception signal that serves as the first high-frequency signal, a second reception signal that serves as the second high-frequency signal, a third reception signal that serves as the third high-frequency signal, and a fourth reception signal that serves as the fourth high-frequency signal.

8. The high-frequency module according to claim 7, comprising:
an integrated circuit (IC) chip that comprises the low noise amplifier, wherein
the mounting substrate comprises a rectangular shape in the plan view from the thickness direction of the mounting substrate, and
the IC chip and the switch are at diagonal positions on the first principal surface of the mounting substrate.

9. The high-frequency module according to claim 8, wherein
the IC chip further comprises:
a power splitter configured to distribute the first reception signal and the second reception signal amplified by the low noise amplifier,
a second switch, different from a first switch, that serves as the switch and is connected to an input side of the low noise amplifier, and
a third switch connected to an output side of the low noise amplifier, wherein
the first filter, the second switch, the low noise amplifier, the power splitter, and the third switch are arranged in this order in one direction that intersects the thickness direction of the mounting substrate.

10. The high-frequency module according to claim 8, wherein
the first filter comprises:
an input terminal configured to receive the first reception signal and the second reception signal input from the switch, and
an output terminal configured to output the first reception signal and the second reception signal to the IC chip, and
the first filter is on the first principal surface of the mounting substrate such that the input terminal is on a side of the switch and the output terminal is on a side of the IC chip.

11. The high-frequency module according to claim 1, wherein
the first frequency band comprises a frequency band of Band 28 or a frequency band of n28, and
the second frequency band comprises a frequency band of Band 20 or a frequency band of n20.

12. The high-frequency module according to claim 11, wherein
the third frequency band includes at least one of a frequency band of Band 8, a frequency band of Band 26, and a frequency band of n8.

13. The high-frequency module according to claim 1, further comprising:
a power splitter configured to distribute the first high-frequency signal and the second high-frequency signal that have passed through the first filter.

14. A communication device comprising:
the high-frequency module according to claim 1; and
a signal processing circuit connected to the high-frequency module.

15. The high-frequency module according to claim 2, wherein
the first filter is adjacent to the switch in the plan view from the thickness direction of the mounting substrate.

16. The high-frequency module according to claim 2, wherein
the second filter is adjacent to the switch in the plan view from the thickness direction of the mounting substrate.

17. The high-frequency module according to claim 3, wherein
the second filter is adjacent to the switch in the plan view from the thickness direction of the mounting substrate.

18. The high-frequency module according to claim 2, further comprising:
a resin layer configured to cover, on a side of the first principal surface of the mounting substrate, at least a portion of the first filter, at least a portion of the second filter, at least a portion of the third filter, and at least a portion of the switch; and
a shield layer configured to cover at least a portion of the resin layer.

19. The high-frequency module according to claim 3, further comprising:
a resin layer configured to cover, on a side of the first principal surface of the mounting substrate, at least a portion of the first filter, at least a portion of the second filter, at least a portion of the third filter, and at least a portion of the switch; and
a shield layer configured to cover at least a portion of the resin layer.

20. The high-frequency module according to claim 4, further comprising:
a resin layer configured to cover, on a side of the first principal surface of the mounting substrate, at least a portion of the first filter, at least a portion of the second filter, at least a portion of the third filter, and at least a portion of the switch; and
a shield layer configured to cover at least a portion of the resin layer.

* * * * *